US005763021A

United States Patent [19]

Young et al.

[11] Patent Number: 5,763,021
[45] Date of Patent: Jun. 9, 1998

[54] METHOD OF FORMING A DIELECTRIC FILM

[75] Inventors: Andrew W. Young, Georgetown; Don D. Smith, Round Rock, both of Tex.

[73] Assignee: Cypress Semiconductor Corporation, San Jose, Calif.

[21] Appl. No.: 766,608

[22] Filed: Dec. 13, 1996

[51] Int. Cl.⁶ .................................................. H05H 1/24
[52] U.S. Cl. .................. 427/579; 427/255.2; 427/255.3; 427/294; 427/585
[58] Field of Search ................................ 427/579, 585, 427/255.2, 255.3, 294

[56] References Cited

U.S. PATENT DOCUMENTS

| 4,579,571 | 4/1986 | Hicks .................................. 65/3.12 |
| 4,894,352 | 1/1990 | Lane et al. ......................... 437/238 |
| 5,215,787 | 6/1993 | Homma ............................. 427/248.1 |
| 5,288,518 | 2/1994 | Homma ............................. 427/255.1 |
| 5,334,454 | 8/1994 | Caporiccio et al. ................ 428/412 |
| 5,334,552 | 8/1994 | Homma ............................. 437/195 |
| 5,429,995 | 7/1995 | Nishiyama et al. ................ 437/238 |
| 5,563,105 | 10/1996 | Dobuzinsky et al. ............. 437/240 |
| 5,571,576 | 11/1996 | Qian et al. ......................... 427/574 |
| 5,578,531 | 11/1996 | Kodera et al. ..................... 437/228 |
| 5,629,246 | 5/1997 | Iyer ..................................... 438/763 |
| 5,633,211 | 5/1997 | Imai et al. .......................... 438/760 |
| 5,643,640 | 7/1997 | Chakravarti et al. .............. 427/578 |
| 5,661,093 | 8/1997 | Ravi et al. ......................... 438/763 |

OTHER PUBLICATIONS

*J.Electrochem.Soc.* vol. 143, No. 6, Jun., 1996 Dielectric Constant and Stability of Fluorine–Doped Plasma Enhanced Chemical Vapor Deposited SiO Thin Films, Peter W. Lee, Shinsuke Mizuno, Amrita Verma, Huyen Tran and Bang Nguyen.

*Primary Examiner*—Bernard Pianalto
*Attorney, Agent, or Firm*—Oblon, Spivak, McClelland, Maier & Neustadt, P.C.

[57] ABSTRACT

The present invention relates to a method of forming a dielectric film, a semiconductor device comprising the same, a method of operating a plasma enhanced chemical vapor deposition apparatus and a method of manufacturing a semiconductor device comprising the dielectric film.

15 Claims, No Drawings

METHOD OF FORMING A DIELECTRIC FILM

BACKGROUND OF THE INVENTION

1. Field of the Invention

The present invention relates to a method of forming a dielectric film, a semiconductor device comprising same, a method of operating a plasma enhanced chemical vapor deposition apparatus and a method of manufacturing a semiconductor device comprising a dielectric film.

2. Discussion of the Background

In the manufacture of semiconductor devices, layers of dielectric materials are often used to separate electrically conductive regions. The deposition of a dielectric film with uniform and reproducible electronic properties is desirable, since unaccounted-for changes in the electronic properties of a dielectric layer can produce drastic changes in the performance of a semiconductor device.

In particular, during the plasma enhanced chemical vapor deposition of a silicon dioxide film from TEOS, modulations in $V_{tfmn0}$, are sometimes observed. $V_{tfmn0}$ is the threshold voltage of an n channel metal gate field oxide device with a 0 voltage back bias. Such a modulation in $V_{tfmn0}$ can create an unacceptable loss of product due to loss of threshold voltage reproducibility.

Lee et al J. Electrochem. Soc., vol 143, No. 6, pp 2015 June (1996) report the preparation of fluorine-doped plasma enhanced chemical vapor deposited $SiO_2$ thin films having dielectric constants as low as 3.7 or below. The problem of modulation of $V_{tfmn0}$ is not reported in this reference.

Accordingly, methods of depositing dielectric films having reproducible electronic properties are being sought.

SUMMARY OF THE INVENTION

Accordingly, one object of this invention is to provide a novel method of depositing a dielectric film.

According to another object of this invention is to provide a novel dielectric film material.

According to another object of this invention is to provide a silicon substrate having a novel dielectric film material with consistent dielectric properties deposited thereon.

According to another object of this invention is to provide a novel semiconductor device having a dielectric film material with consistent dielectric properties deposited thereon.

According to another object of this invention is to provide a method of operating a plasma enhanced chemical vapor deposition apparatus.

According to another object of this invention is to provide a method of making a semiconductor device having a dielectric film material with consistent dielectric properties deposited thereon.

These and other embodiments of the present invention are made possible by a method of forming a dielectric film by plasma enhanced chemical vapor deposition, in which a silicon source and an oxygen source are reacted in the presence of a halogen source.

DETAILED DESCRIPTION OF THE PREFERRED EMBODIMENTS

Any dielectric layer capable of being formed by plasma enhanced CVD may be formed according to the present method. In particular, the bulk of the dielectric layer according to the present invention may be a conventional PECVD dielectric and may include silicate glass, phosphosilicate glass (PSG), borosilicate glass (BSG), borophosphosilicate glass (BPSG) as well as undoped oxides, nitrides, oxynitrides, carbides (i.e. silicon nitride and silicon oxynitride), and multilayer combinations thereof (e.g., oxide-nitride, oxide-nitride-oxide, etc.).

Examples of silicon sources of include tetraethylorthosilicate (TEOS), silicon hydride ($SiH_4$), $SiCl_4$, $SiBr_4$, $SiH_xCl_y$ (where x+y=4 and both x and y>1), and mixtures thereof. The silicon source may be, and preferably is, mixed with an inert carrier gas such as argon or helium. An oxygen-containing carrier gas may also be used, especially when the silicon source is TEOS. The mixture of silicon compound and carrier gas preferably contains from 0.1 vol. % to about 20 vol. % of silicon compound. When TEOS is the silicon source TEOS is preferably introduced at a rate of about 1–4 mL/min, more preferably 1.5–3.0 mL/min, even more preferably about 1.8 mL/min.

The source of oxygen may also include various oxygen-containing gases and/or vapors including $O_2$, $O_3$, $H_2O_2$, NO, mixtures of $CO_2$ with hydrogen, $N_2O$, $H_2O$ and mixtures thereof. Typically, the oxygen source comprises either all $O_2$ or all $N_2O$. Preferably, however, the oxygen source will comprise a mixture of oxygen-containing gases containing at least 1 volume percent $O_3$, with the balance comprising $O_2$. The source of oxygen may also include a carrier gas such as helium, argon or nitrogen, preferably such that at least 10 vol. % of such a mixture comprise an oxygen-containing gas. The oxygen source is generally introduced into the vacuum decomposition chamber at a flow rate ranging from about 4 to about 12 l/min, more preferably 5–10 l/min and even more preferably about 9 l/min.

When ozone is used, the ratio of silicon compound to $O_3$ may range from 1:100 to 2:1, but more preferably from 1:2 to 1:1. When B and/or P sources are used as dopants, $N_2O$ is preferably used as an oxygen source.

Non-limiting examples of sources of phosphorus include triethylphosphine (TEP), trimethyiphosphate (TMP), tris(trimethylsilyl)phosphate, phosphine and mixtures of the same.

Non-limiting examples of sources of boron include trimethylborate (TMB), triethyl borate, tris(trimethylsilyl)borate, diborane, tetraborane, decaborane and mixtures of the same.

The boron or phosphorus sources need not be organic compounds, but when TEOS is the silicon source, the boron-and/or phosphorus-containing compounds used should not be so reactive as to react with $O_3$ before decomposition of the TEOS. Boron- and/or phosphorus-containing organic compounds such as those recited above decompose sufficiently slowly under specific TEOS processing reaction conditions so as to permit the desired reaction with both $O_3$ and TEOS decomposition products.

The amount of boron and phosphorus sources present generally ranges from less than or equal to 1 to 6 wt. %, preferably from 3 to 5 wt. %, for each of the B and or P sources in the dopant/carrier gas mixture, with the balance comprising the carrier gas. For some volatile organic dopant sources, the use of a carrier gas may not be necessary.

Non-limiting examples of substrates which may have deposited thereon the present dielectric layer include silicon, gallium arsenide, silicon on sapphire (SOS), germanium, germanium silicon, diamond, and silicon on insulator (SOI) material. Such substrates may be formed epitaxially in accordance with conventional techniques. Doping techniques known to those of ordinary skill in the art may be used to adjust the conductivity properties of the semiconductor substrate. The substrate may further comprise a substrate region of an electronic device, such as a source and/or drain region of a MOS transistor, and/or gate material of a gate electrode.

A general method for depositing a dielectric layer is described below:

A semiconductor wafer is placed on a support base or susceptor in a CVD chamber of a vacuum deposition apparatus. The wafer and susceptor are heated to a temperature ranging from 300° C. to 450° C., preferably about 350° to 400° C., which is maintained throughout the deposition procedure. The chamber is maintained at a pressure of from about 1 to about 5 Torr during the deposition.

A mixture that forms or is a gas under deposition conditions is then introduced into the deposition chamber. This mixture may comprise one or more sources of a halogen, oxygen and silicon (e.g. a mixture of tetraethylorthosilicate (TEOS), $O_2$ and $C_2F_6$). A carrier gas such as argon, nitrogen or helium may be used in the mixture.

Deposition is preferably conducted with the assistance of plasma ignition between the susceptor on which the wafer rests and the face plate or "shower head" through which the components of the mixture flow into the chamber, preferably in gaseous form. A suitable plasma assisted CVD technique is reported in Lapatovich et al. U.S. Pat. No. 4,436,762, the entire contents of which are hereby incorporated by reference. A method of forming a stable etching plasma is described in Nulty U.S. Pat. No 5,441,596, the relevant portions of which are hereby incorporated by reference. When plasma-assisted CVD deposition is conducted, the power level of the plasma may range from about 25 to about 1,000 watts high frequency, typically about 500 watts, and from about 25 to about 1,000 watts at low frequency, typically about 500 watts. High frequency power generally ranges from 10 to 20 MHz, more preferably 13.56 MHz and may be generated by conventional apparatus such as those manufactured by Novellus and/or Applied Materials. Low frequency power generally ranges from 200 to 400 KHz, preferably from 250 to 350 KHz, even more preferably about 300 KHz. Typically, both high and low frequency power is distributed over eight wafers. However, the power level for each frequency may vary as much as ±100 watts. Low frequency and high frequency power are typically applied in a 1:1 ratio.

Plasma assisted CVD is conduced at reduced pressure, typically at a pressure of 1 to 10 Torr and a temperature of from 300° to 450° C. Plasma enhanced CVD offers the benefits of operating at low temperatures (typically <400° C.) and high processing uniformity within the wafers (typically <2% variation).

In a preferred embodiment, the plasma enhanced chemical vapor deposition apparatus comprises a reaction chamber having one or more exposed aluminum surfaces. Within the context of the present invention, an aluminum surface may be any surface which comprises aluminum, an alloy of aluminum (e.g. 6061) or aluminum oxide, or which may have deposited or grown thereon a layer of an aluminum oxyhalide such as $Al_aO_bX_c$, where "X" is a halogen selected from the group consisting of F, Cl, Br and I, and a=(3b/2) +3c. Non-limiting examples of plasma enhanced chemical vapor deposition apparatus components which may have an exposed aluminum surface include a reaction chamber wall, a support element, a shower head and a susceptor.

The temperature at which CVD is conducted will vary depending on the reactants and whether plasma assistance is provided, and may be determined by conventional methods known to those of ordinary skill in the art without undue experimentation. For example when the mixture comprises TEOS, $O_2$, and $C_2F_6$, a temperature of about 350° C. is preferably used.

According to the present invention, the dielectric film comprises 0.1–0.2 wt. % of halogen atoms. Charge modulation is generally dependent on the halogen concentration and therefore, adjustment of the halogen atom content will be within the level of skill of the artisan, depending on the application.

According to the present method, a halogen source is introduced by conducting plasma enhanced CVD in the presence of a source of a halogen, preferably fluorine. Suitable sources of halogens include $C_2F_6$, $CF_4$, $NF_3$, triethylfluorosilane, $C_2Cl_6$, $CCl_4$, $NCl_3$, triethylchlorosilane, $C_2Br_6$, $CBr_4$, $NBr_3$, triethylbromosilane, $C_2I_6$, $CI_4$, $NI_3$ and triethyliodosilane.

The dielectric film according to the present invention preferably has a permittivity of from 3.75 to 4.2, more preferably from 4.0 to 4.2.

The dielectric film according to the present invention preferably will preferably have a refractive index of 1.40 to 1.46, more preferably from 1.43 to 1.45, even more preferably from 1.43 to 1.44, wherein the refractive index in the undoped state is preferably about 1.47.

A halogen-containing dielectric layer according to the present invention may also be prepared by ion implantation of a dielectric layer. Suitable ion implantation techniques, known to those of ordinary skill in the art may be used. For example a helicon plasma source with a magnetic mass filter and one or more electrostatic accelerator columns may he used.

PECVD is preferably conducted at a flow rate of 9 l/min $O_2$, 1.8 mL/min TEOS and <200 sccm, preferably about 50 sccm of halogen, at a plasma power of about 500 watts high frequency and 500 watts and low frequency.

The present invention is also directed to a method of operating a plasma enhanced chemical vapor deposition apparatus.

During the operation of a plasma enhanced chemical vapor deposition apparatus, it is common for the reaction chamber to accumulate material, wherein the reaction chamber is periodically cleaned. In order to clean a PECVD apparatus, it is common to use a plasma cleaning process with a plasma comprising $C_2F_6$ and $O_2$. The $C_2F_6$ and $O_2$ plasma converts many of the deposited materials to volatile compounds which are then exhausted from the system.

However, such removal of deposited materials is frequently accompanied by the formation of $Al_xO_yF_z$ as a deposit on the surface of the PECVD apparatus. Over time, the amount of $Al_xO_yF_z$ may increase to an appreciable and/or consistent amount. Although the presence of $Al_xO_yF_z$ has not been particularly a problem, it has now been discovered that $Al_xO_yF_z$ may be incorporated into a film being deposited in a chamber having $Al_xO_yF_z$ deposits on a surface therein. This can possibly result in the presence of fluorine in the film. The presence of a small amount of fluorine is not typically enough to affect the dielectric properties of a deposited dielectric material. However, variations in the amount of fluorine can cause variations in the properties of deposited dielectric materials sufficient to adversely affect the reproducibility of a semiconductor processing method in which the dielectric layer is deposited.

Accordingly, the present invention also concerns a method of operating a plasma enhanced chemical vapor deposition apparatus, comprising the steps of:

1) depositing in a deposition apparatus, a dielectric film in the presence of a plasma comprising at least one chemical vapor source of said dielectric film and a halogen dopant;

2) cleaning said deposition apparatus with a cleaning plasma;

3) replacing a component of said deposition apparatus, wherein said component of said deposition apparatus comprises an aluminum surface exposed to either or both of said plasma and/or said cleaning plasma.

According to the present method of operating a PECVD apparatus, deposition of the dielectric film is conducted under otherwise conventional plasma chemical vapor deposition conditions, but in the presence of a halogen dopant.

According to the present method of operating, cleaning may comprise a plasma cleaning process, for example using $C_2F_6$ (or other fluoro[hydro]carbon of the formula $C_xH_yF_z$, where $1 \leq x \leq 4$, y+z=2x or (2x+2), and $z \geq 2$, preferably >4) and $O_2$.

According to the present method of operating, the plasma enhanced chemical vapor deposition apparatus comprises a reaction chamber having one or more components having an exposed aluminum surface. Within the context of the present invention, an exposed aluminum surface may be any surface which comprises aluminum, an alloy of aluminum (e.g. 6061) or aluminum oxide, or which may have deposited thereon a layer of an aluminum oxyhalide such as $Al_aO_bX_c$, where "X" is a halogen selected from the group consisting of F, Cl, Br and I and a=(3b/2)+3c. Non-limiting examples of plasma enhanced chemical vapor deposition apparatus components which may have an exposed aluminum surface include a reaction chamber wall, a support element, a shower head and a susceptor.

Operation of a plasma enhanced chemical vapor deposition apparatus as described above, allows for the preparation of a dielectric layer with reproducible properties.

Accordingly, the present invention also concerns a method of manufacturing a semiconductor device which comprise a dielectric film in a plasma enhanced chemical vapor deposition apparatus, comprising the steps of:

1) cleaning a chemical vapor deposition apparatus with a plasma;

2) replacing a component of said deposition apparatus which comprises an exposed aluminum surface;

3) depositing in said chemical vapor deposition apparatus a dielectric film on a substrate in the presence of a plasma containing one or more chemical vapor sources of said dielectric film and a halogen dopant.

The present semiconductor manufacturing method may further comprise, prior to step 1), the step of operating the chemical vapor deposition apparatus. Such operation of operating may be under conventional operating conditions for depositing, which includes but is not limited to depositing a dielectric layer. The remaining steps are as previously described above. Manufacture of a semiconductor device as described above allows for the preparation of a semiconductor device comprising a dielectric layer with reproducible properties.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of depositing a dielectric film comprising:
   conducting plasma enhanced CVD in the presence of a silicon source, an oxygen source and a fluorine source, at a pressure of 1 to 10 Torr and a temperature of from 300° to <400° C., to produce a dielectric film comprising 0.1–0.2 wt. % of fluorine atoms.

2. The method of claim 1, wherein said oxygen source is $O_3$.

3. The method of claim 1, wherein said halogen source is selected from the group consisting of $C_2F_6$, $CF_4$, $NF_3$, triethylfluorosilane, $C_2Cl_6$, $CCl_4$, $NCl_3$, triethylchlorosilane, $C_2Br_6$, $CBr_4$, $NBr_3$, triethylbromosilane, $C_2I_6$, $CI_4$, $NI_3$, triethyliodosilane and mixtures thereof.

4. The method of claim 1, wherein said silicon source is selected from the group consisting of tetraethylorthosilicate (TEOS), silicon hydride ($SiH_4$), $SiCl_4$, $SiBr_4$, $SiH_xCl_y$ (where x+y=4, and both x and $y \geq 1$), and mixtures thereof.

5. The method of claim 1, wherein said silicon source is tetraethylorthosilicate.

6. The method of claim 1, wherein plasma enhanced chemical vapor deposition is conducted in the further presence of an inert carrier gas.

7. The method of claim 6, wherein said silicon source is tetraethylorthosilicate which is present in an amount of 0.1 to 20 vol % relative to said inert carrier gas.

8. The method of claim 1, wherein said fluorine source is introduced at a rate of $\leq 200$ sccm.

9. The method of claim 1, wherein said source of oxygen is selected from the group consisting of $O_2$, $O_3$, $H_2O_2$, NO, $N_2O$, or $CO_2$ with hydrogen and mixtures thereof.

10. The method of claim 1, wherein plasma enhanced chemical vapor deposition is conducted at a power of from about 25 to about 1,000 watts high frequency, and from about 25 to about 1,000 watts at low frequency.

11. The method of claim 10, wherein low frequency and high frequency power are applied in a 1:1 ratio.

12. The method of claim 1, wherein plasma enhanced chemical vapor deposition is conducted at a pressure of about 1 to 5 T.

13. The method of claim 1, wherein plasma enhanced chemical vapor deposition is conducted with the assistance of plasma ignition.

14. The method of claim 1, wherein said silicon source is tetraethylortho silicate, which is introduced at a rate of about 1 to 4 mL/min.

15. The method of claim 1, wherein said oxygen source is introduced at a flow rate from about 4 to 12 l/min.

* * * * *